United States Patent [19]

Nakano et al.

[11] Patent Number: 4,704,706

[45] Date of Patent: Nov. 3, 1987

[54] BOOSTER CIRCUIT

[75] Inventors: Masao Nakano, Kawasaki; Yoshihiro Takemae; Kimiaki Sato, both of Tokyo; Nobumi Kodama, Kawasaki, all of Japan

[73] Assignee: Fujitsu Limited, Kanagawa, Japan

[21] Appl. No.: 850,330

[22] Filed: Apr. 11, 1986

[30] Foreign Application Priority Data

Apr. 13, 1985 [JP] Japan .................. 60-077547

[51] Int. Cl.$^4$ .............................. G11C 7/00
[52] U.S. Cl. .................. 365/203; 307/482; 307/578
[58] Field of Search ............ 365/203; 307/482, 578

[56] References Cited

U.S. PATENT DOCUMENTS 3,976,892  8/1976  Buchanan ................. 307/482
4,521,701  6/1985  Reddy ..................... 307/578
4,570,088  2/1986  Nozaki et al. ............. 307/482

Primary Examiner—James W. Moffitt
Attorney, Agent, or Firm—Armstrong, Nikaido, Marmelstein & Kubovcik

[57] ABSTRACT

A booster circuit including a precharge capacitor ($C_2$), a precharge driver circuit (20) having a first bootstrap circuit ($C_{59}$, $Q_{58}$, $Q_{61}$) and precharging a voltage to the precharge capacitor in a reset mode, and an output driver circuit (19) having a switching circuit ($Q_{21}$) for cutting off the output of the precharged voltage of the precharged capacitor in the reset mode and a second bootstrap circuit driving the switching circuit in an operation mode. The booster circuit further includes an additional switching circuit ($Q_1$) for outputting a voltage to be superimposed onto the precharge voltage in the operation mode.

The booster circuit may be applicable to a dynamic semiconductor memory device, for boosting a voltage of a word line at a high speed and for improving integration.

8 Claims, 6 Drawing Figures

BOOSTER CIRCUIT

BACKGROUND OF THE INVENTION

1. Field of the Invention

The present invention relates to a booster circuit. More particularly, it relates to a booster circuit in a semiconductor memory device.

2. Description of the Related Arts

When the memory capacity of a dynamic random access memory (D-RAM) is increased, a voltage of a word line must be boosted above a voltage $V_{CC}$ of a power source at a high speed, since memory cells connected to the word line increase, and thus increase a capacitance of the word line connected thereto. In addition, in a stacked-capacitor type RAM, the capacitance of the word line is greatly increased. On the other hand, the boosting of the word line voltage will contribute to an improvement of the resistance against a soft error.

Booster circuits have been applied to DRAM devices having a large number of memory cells, for example 256 Kbits or more. The boosting of the voltage is realized by providing a capacitor having a capacitance which may be several times that of the capacitance of the word line connected thereto. A DRAM of 256 Kbits has 1024 memory cells along one word line, but a DRAM of 1 Mbits has 2048, accordingly, in the 1 Mbits DRAM, the capacitance connected to the word line is increased by as much as twice that of the 256 Kbits DRAM. This means that, for boosting, a large capacitance of the above capacitor is required in the DRAM devices having a large number of memory cells. Acordingly, it would seem that these devices suffer from the disadvantages of a low integration of the DRAM device due to the capacitor used to provide the above capacitance having a large area, thus preventing a high integration, and a low speed response for fully changing the voltage in the capacitor in question.

The defects of the prior arts will be described later in detail with reference to the drawings.

SUMMARY OF THE INVENTION

An object of the present invention is to provide a booster circuit having a small size capacitor for boosting and a low power consumption and high speed operation.

Another object of the present invention is to provide a booster circuit, preferably applicable to a semiconductor memory device, for boosting a voltage of a word line of the device and improving integration of the device.

According to the present invention, there is provided a booster circuit for producing a boosted output signal including: first and second power sources for supplying a power source voltage; a first driver circuit connected between the first and second power sources and including a first bootstrap circuit for receiving first and second signals having exclusive logic levels and producing a first output signal in response to the first and second signals; a precharge capacitor operatively connected to receive the first output signal from the first driver circuit, for producing a second output signal having a voltage level higher than the power source voltage in response to the first output signal, the precharge capacitor being precharged when the second signal is supplied; and a second driver circuit connected between the first and second power sources, receiving the first and second signals, and including a second bootstrap circuit for producing a third output signal in response to the first and second signals, and a first switching circuit having a terminal connected to receive the second output signal from the precharge capacitor, and an output terminal from outputting the boosted output signal having a voltage level higher than the power source voltage, the first switching circuit switching to transfer the second output signal to the output terminal to form the boosted output signal in response to the third output signal. The booster circuit further includes a second switching circuit connected between the first power source and the output terminal and operating in response to the first signal.

The second switching circuit outputs a voltage to the output terminal in response to the first signal in advance of the switching of the first switching circuit.

The booster circuit preferably is applicable to a semiconductor memory device, for boosting a voltage of a word line at a high speed and improving integration.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Before describing preferred embodiments of the present invention, a description will be given of the prior arts for reference.

Figure 1:
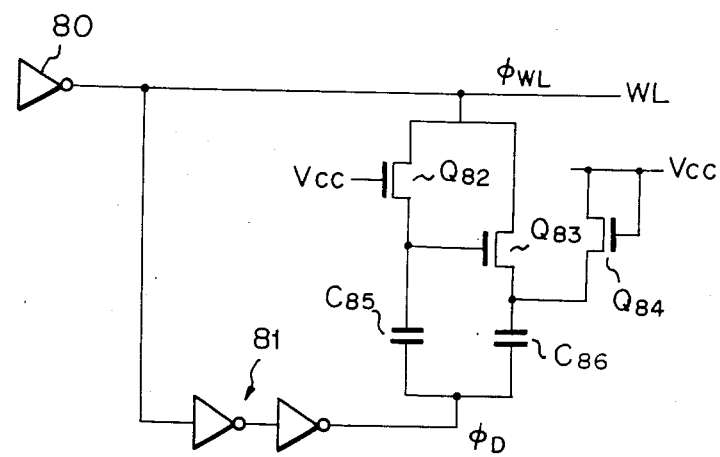
FIG. 1 is a circuit diagram of a prior art boosting circuit.

FIG. 1 is a circuit diagram of a prior art word line voltage booster circuit disclosed in "DENSHI GIGYUTSU (Electronics Engineering)" Vol. 23, No. 3, pp 31. The circuit in FIG. 1 consists of a word line signal generation circuit 80, a delay circuit 81, MOS transistors $Q_{82}$, $Q_{83}$, and $Q_{84}$, and capacitors $C_{85}$ and $C_{86}$. The precharge capacitor $C_{86}$ is provided to boost a voltage of the word line WL. When a word line voltage $\phi_{WL}$ is raised to $V_{CC}$, the transistor $Q_{82}$ is turned ON, precharging the capacitor $C_{86}$ from the word line WL. A load connected to the word line WL is reduced to half. The capacitor $C_{86}$ is precharged through the transistor $Q_{84}$. When $\phi_D$ is raised to $V_{CC}$, the transistor $Q_{83}$ is turned ON, superimposing the voltage precharged in the capacitor $C_{86}$ onto the voltage of $V_{CC}$-$V_{TH}$. $V_{TH}$ represents a threshold voltage of the transistor.

However, in the circuit of FIG. 1, the capacitor $C_{85}$ having a capacitance less than the capacitor $C_{86}$ is connected to the word line WL, in addition to capacitors of the memory cells. Accordingly, the reduction of the power consumption in and the speed up of the circuit are still limited.

Figure 2:
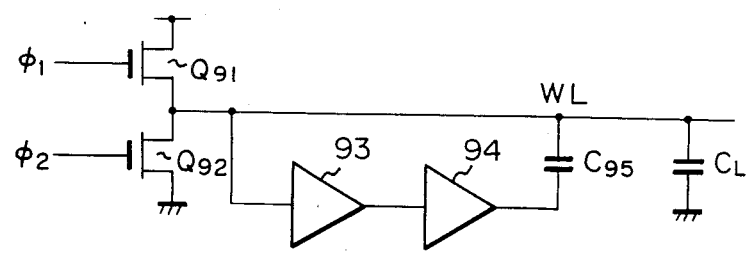
FIG. 2 is a circuit diagram of another prior art boosting circuit.

FIG. 2 is a circuit diagram of another prior art word line voltage booster circuit disclosed in NIKKEI ELECTRONICS, Oct. 24, 1983, PP. 185. The circuit shown in FIG. 2 consists of MOS transistors $Q_{91}$ and $Q_{92}$, normal bootstrap buffers 93 and 94, and a precharge capacitor $C_{95}$. A capacitor $C_L$ represents a capacitor of the memory cells as a load.

Since the precharge capacitor $C_{95}$ is directly connected to the word line WL, a load of the transistor $Q_{91}$ is increased, and the operating speed of the circuit is slow.

Figure 3:
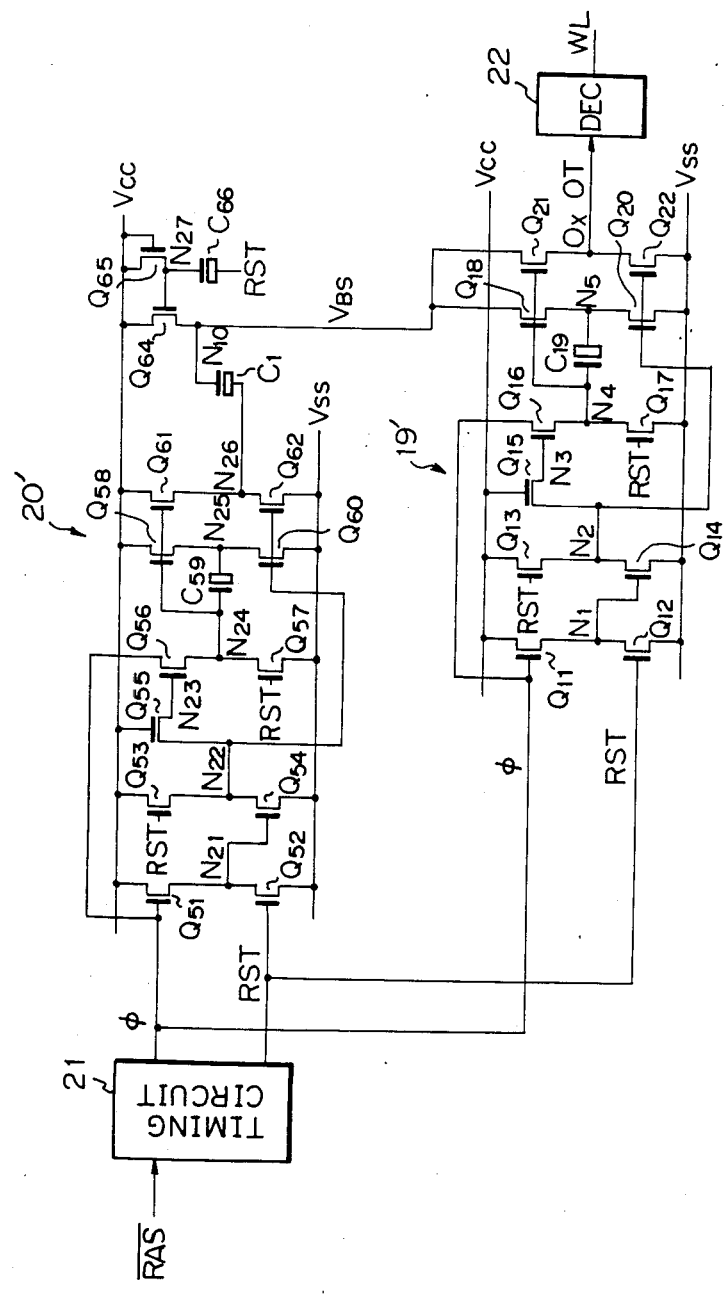
FIG. 3 is a circuit diagram of still another prior art boosting circuit.

FIG. 3 shows still another prior art word line voltage booster circuit consisting of a first driver circuit 20', a second driver circuit 19', and a precharge capacitor $C_1$ provided between these circuits 20' and 19'. The driver circuits 19' and 20' receive a clock signal $\phi$ and a reset signal RST from a timing circuit 21 which outputs the signals $\phi$ and RST in response to a row address select $\overline{RAS}$ signal. An output OT of the driver circuit 19 is supplied to a word line WL through a row decoder 22.

The driver circuit 19' consists of MOS transistors $Q_{11}$ to $Q_{22}$ and a bootstrap capacitor $C_{19}$. The driver circuit 20' consists of MOS transistors $Q_{51}$ through $Q_{65}$, which are interconnected between the voltage sources $V_{CC}$ and $V_{SS}$, and a bootstrap capacitor $C_{59}$ and a capacitor $C_{66}$. References $N_1$ to $N_5$ and $N_{21}$ to $N_{27}$ indicate nodes.

In FIG. 3, the capacitor $C_1$ for precharging the voltage is provided between the node $N_{26}$ and a source of the transistor $Q_{64}$ connected to drains of the transistors $Q_{18}$ and $Q_{21}$. The precharge capacitor $C_1$ is not directly connected to the word line, since it is cut off by the transistor $Q_{21}$ in a reset mode. Accordingly, the circuit shown in FIG. 3 is beneficial to the problem of the circuit shown in FIG. 2. In addition, a capacitor corresponding to the capacitor $C_{85}$ in FIG. 1 is not provided in the circuit shown in FIG. 3, and accordingly, the circuit shown in FIG. 3 is beneficial to the problems of the circuit shown in FIG. 1.

However, the circuit shown in FIG. 3 still suffers from disadvantages which will be described later.

The operation of the circuit in FIG. 3 will be described with reference to the various voltage wave forms in FIG. 4. At first, the reset signal RST, which is one of the input signals to the circuit 20', remains at the "H" level, and the signal $\phi$, which is another input to the circuit 20', remains at the "L" level. Thus, the transistor $Q_{52}$ is kept ON, the transistor $Q_{51}$ is kept OFF, the node $N_{21}$ is kept "L", the transistor $Q_{54}$ is kept OFF, and the transistor $Q_{53}$ is kept ON. Therefore, the nodes $N_{22}$ and $N_{23}$ are kept "H", and accordingly, the gate capacitance of the transistor $Q_{56}$ is charged up and the transistors $Q_{60}$ and $Q_{62}$ are kept ON. In addition, the node $N_{24}$ is kept "L", and therefore the transistors $Q_{58}$ and $Q_{61}$ are kept OFF and the nodes $N_{25}$ and $N_{26}$ are kept "L". Furthermore, the node $N_{27}$ is kept at the "HH" level, higher than the normal "H" level, due to the bootstrap effect according to the MOS capacitor $C_{66}$ and the signal RST so that the transistor $Q_{64}$ is kept fully ON. Therefore, the MOS capacitor $C_1$ is charged up at the level of the voltage source $V_{CC}$. Thus, at this stage, the output voltage $V_{BS}$ of the circuit 20' is kept at the $V_{CC}$ level.

Under the above-mentioned condition, when the signal RST falls, the potential $VN_{27}$ of the node $N_{27}$ falls to a level lower than the $V_{CC}$ level by the threshold voltage $V_{TH}$ of the transistor $Q_{65}$, and the MOS capacitor $C_{66}$ is charged up to this potential ($V_{CC}-V_{TH}$) so that any charge lost in the capacitor $C_{66}$ while the bootstrap effect is being carried out is compensated. In addition, the output voltage $V_{BS}$, which has been kept at the $V_{CC}$ level, is disconnected from the voltage source $V_{CC}$ because the transistor $Q_{64}$ is turned OFF. This falling of the signal RST is effected before the rise of the signal $\phi$. When the signal $\phi$ rises after the falling of the signal RST, the transistor $Q_{51}$ is turned ON, the $Q_{52}$ is kept OFF, the node $N_{21}$ is turned to "H", the transistor $Q_{54}$ is turned ON, the transistor $Q_{53}$ is kept OFF, the node $N_{22}$ is turned to "L", the transistors $Q_{56}$, $Q_{60}$, $Q_{62}$ are turned OFF, and the transistor $Q_{57}$ is kept OFF. Therefore, the node $N_{24}$ receiving the signal $\phi$ because the transistor $Q_{56}$ is turned ON is turned to "H", the transistors $Q_{58}$ and $Q_{61}$ are turned ON, and the nodes $N_{25}$ and $N_{26}$ are turned to "H". Since the MOS capacitor $C_1$ is charged up at the voltage source $V_{CC}$ as described above, the output voltage $V_{BS}$ is pushed above the voltage source $V_{CC}$ as shown in FIG. 4 when the mode $N_{26}$ rises to the level of $V_{CC}$ due to the bootstrap effect of the MOS capacitor $C_{59}$.

While in the circuit 19', when the signal $\phi$ rises, the transistor $Q_{11}$ is turned ON, the transistor $Q_{12}$ is turned OFF, the node $N_1$ is turned to "H", the transistor $Q_{14}$ is turned ON, and the transistor $Q_{13}$ is kept OFF, and accordingly, the node $N_2$ falls to the "L" level. Thus, the transistors $Q_{20}$ and $Q_{22}$ are turned OFF. Further, at the period between the signal $\phi$ rise and the node $N_3$ charging, the transistor $Q_{16}$ is kept ON, the transistor $Q_{17}$ is kept OFF, and accordingly, the node $N_4$ rises together with the signal $\phi$. Accordingly, the transistors $Q_{18}$ and $Q_{21}$ are turned ON and are still more fully turned ON due to the bootstrap effect according to the MOS capacitor $C_{19}$. Therefore, the levels of the node $N_5$ and the output OT rise rapidly above the voltage source $V_{CC}$ following the output voltage $V_{BS}$ which is pushed up to the "HH" level, as shown in FIG. 4.

The capacitor $C_1$ is charged up before the rising of the signal $\phi$, and the transistor $Q_{64}$ in the charging circuit for the capacitor $C_1$ is turned OFF so that the output $V_{BS}$ is pushed up through the capacitor $C_1$ by the rising of the node $N_{26}$ in response to the rising of the signal $\phi$, and the output voltage $V_{BS}$ is increased. Thus, the circuit of FIG. 3 has an advantage in that there is no delay in operation. Further, since the capacitor $C_1$ is used as a voltage supply to the signal $\phi$ and is necessary for charging up the parasitic capacity accompanying the signal line of $\phi$, the capacity of the capacitor $C_1$ should be relatatively large. Because the capacitor $C_1$ has been charged up through the transistor $Q_{64}$ preceding the rising of the signal $\phi$, the large capacity of the capacitor $C_1$ does not cause a delay in operation. Accordingly, the access time of the memory device can be decreased by speeding up the rising transition of the output OT.

However, in the circuit shown in FIG. 3, a charge accumulated in the capacitor $C_1$ is all output, and accordingly, if an even higher boosted voltage output to the word line is required in response to the increasing memory capacity, such as a 1 mega bit RAM device, an area forming the capacitor $C_1$ having a capacitance which may be several times that of a load capacitance must be greatly increased. On the other hand, apparently the area forming the capacitor must be minimized due to the requirements of high integration and high density, etc. That is, the circuit in FIG. 3 encounters a problem of antonymity.

An embodiment of the present invention will now be described.

Figure 5:
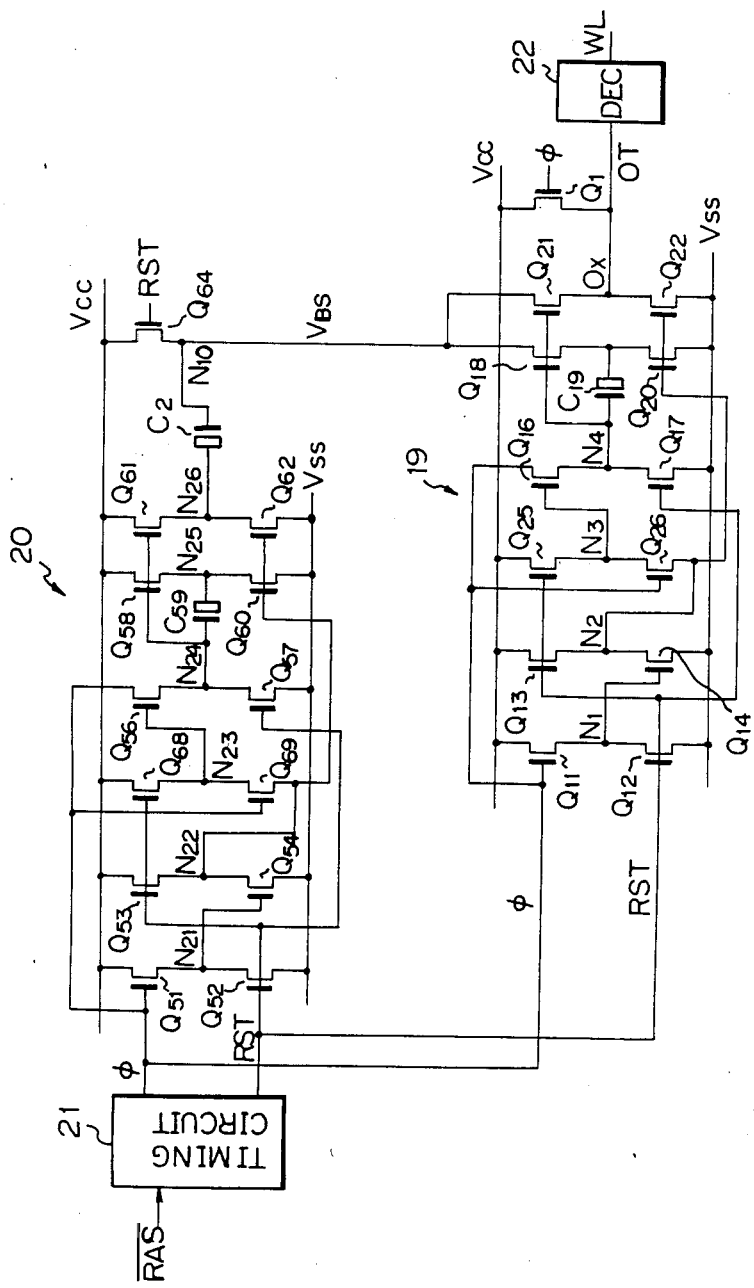
FIG. 5 is a circuit diagram of a boosting circuit of an embodiment in accordance with the present invention.

Referring to FIG. 5, a booster circuit includes a first driver circuit 20, a second driver circuit 19, a precharge capacitor $C_2$, and an additional MOS transistor $Q_1$.

The first driver circuit 20 consists of MOS transistors $Q_{51}$ to $Q_{54}$, $Q_{56}$ to $Q_{64}$, $Q_{68}$ and $Q_{69}$, and a boostrap capacitor $C_{59}$. The first driver circuit 20 is similar to the driver circuit 20' in FIG. 3. The transistors $Q_{68}$ and $Q_{69}$ are provided instead of the transistor $Q_{55}$ in FIG. 3, however, the principle of the operation of the driver circuit 20 is similar to that of the driver circuit 20' set forth above. In FIG. 5, the transistor $Q_{65}$ and the capacitor $C_{66}$ in FIG. 3 are added, and the reset signal supplied to a gate of the transistor $Q_{64}$ in FIG. 5 may be regarded as a signal having the same nature as the node $N_{27}$ in FIG. 3, set forth above.

Similarly, the driver circuit 19 has a same circuit construction as that of the driver circuit 19' in FIG. 3, except that MOS transistors $Q_{25}$ and $Q_{26}$ are provided instead of the transistor $Q_{15}$ in FIG. 3.

The precharge capacitor $C_2$ is provided in a same way as the capacitor $C_1$ in FIG. 3, and thus the basic function of the capacitor $C_2$ is identical to that of the capacitor $C_1$.

The transistor $Q_1$ is added between the $V_{CC}$ and an output terminal $O_X$ of the output OT. The transistor $Q_1$ receives the clock signal $\phi$ at a gate thereof.

The operation of the circuit in FIG. 5 will be described with reference to FIG. 6.

When a $\overline{RAS}$ signal is not supplied to the timing circuit 21, in a reset mode, the timing circuit 21 outputs the reset signal RST having a high level, and the node $N_{10}$ is then precharged, as set forth above. The duration of the reset mode is normally long enough to fully precharge the voltage in the precharge capacitor $C_2$.

Upon receipt of the RAS signal, the timing circuit 21 causes a fall in the reset signal RST and a rise in the clock signal $\phi$, the reset signal RST and the clock signal being exclusive even if in a transition state.

By increasing the clock signal $\phi$, a voltage $VN_{10}$ at the node $N_{10}$ will be further raised to the voltage $V_{CC}$, and a voltage $VN_4$ at the node $N_4$ is raised due to the boostrap effect of the capacitor $C_{19}$. When the voltage $VN_4$ reaches a predetermined level sufficient to fully turn ON the transistor $Q_{21}$, the voltage $VN_{10}$ at the node $N_{10}$ is output to the output terminal $O_X$. At the same time, the clock signal $\phi$ reaches the level $V_{CC}$, and accordingly, the transistor $Q_1$ is also fully turned ON. Consequently, the voltage $V_{OT}$ at the output terminal $O_X$ is superimposed onto the voltage of $V_{CC}$ through the transistor $Q_1$, to the voltage from the node $N_{10}$ through the transistor $Q_{21}$.

The bootstrap circuit consisting of the capacitor $C_{59}$ and the transistors $Q_{58}$ and $Q_{61}$ has a feature of fully discharging the charge stored in the precharge capacitor $C_2$ to the output terminal $O_X$ through the transistor $Q_{21}$ in an operation mode when the clock signal is enable. The bootstrap circuit including the capacitor $C_{19}$ and the transistor $Q_{18}$ has a feature of fully turning ON the transistor $Q_{21}$ in the operation mode.

In the reset mode, the capacitor $C_2$ is precharged, however, the capacitor $C_2$ is cut off from the word line WL by the transistor $Q_{21}$. The transistor $Q_1$ is also turned OFF. Accordingly, the output of voltage $V_{OT}$ at the terminal $O_X$ is the voltage of $V_{SS}$, which may be zero volt, in the reset mode. While, in the operation mode, the superimposed voltage of the precharged voltage of the precharge capacitor $C_2$ and the voltage of $V_{CC}-V_{TH}$, which may be 4 volts, i.e., the boosted voltage, may appear at the output terminal $O_X$ and be output to the word line WL through the decoder 22.

Apparently, the driver circuit 20 functions as a precharge circuit for the capacitor $C_2$, and the driver circuit 19 functions as a switching circuit for outputting or cutting the precharged voltage. The additional transistor $Q_1$ functions as a switching circuit for superimposing the voltage $V_{CC}$ onto the precharge voltage.

Figure 4:
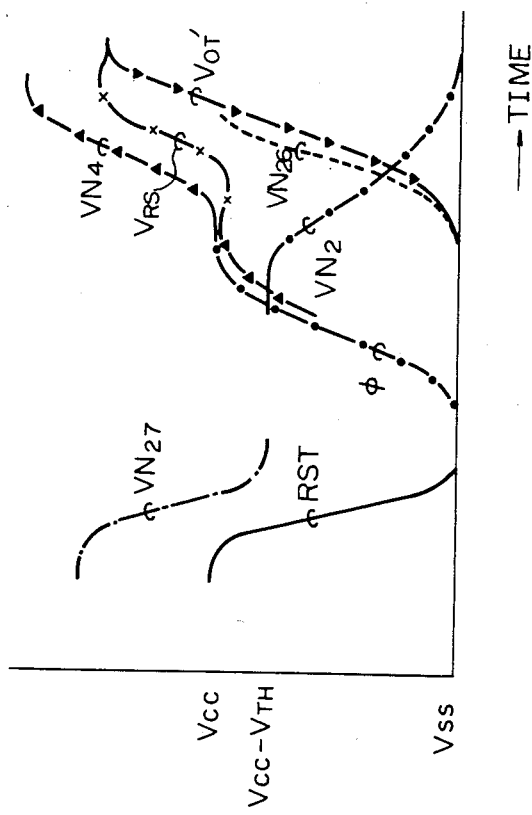
FIG. 4 is a graph illustrating wave forms in the circuit in FIG. 3.
Figure 6:
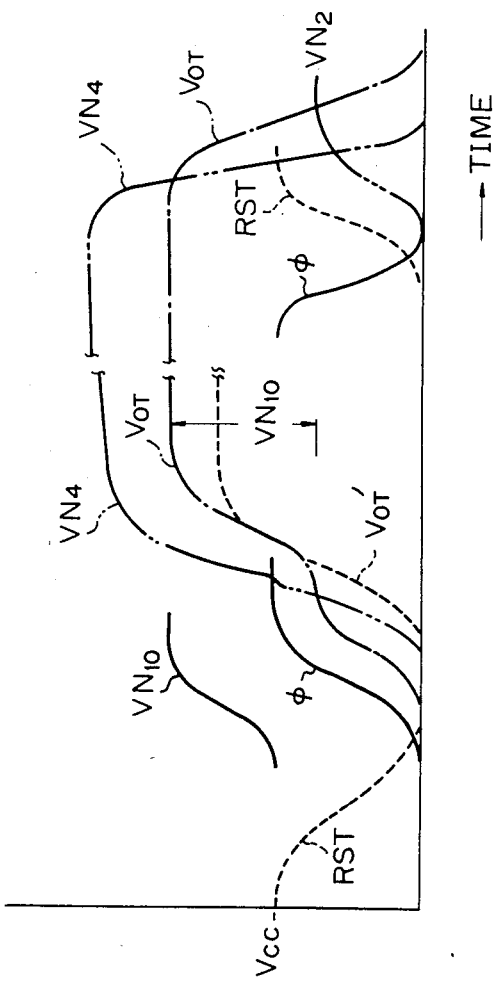
FIG. 6 is a graph illustrating wave forms in the circuit in FIG. 5.

When the capacitance of the precharge capacitor $C_2$ in FIG. 5 is identical to that of the capacitor $C_1$, apparently, the voltage $V_{OT}$ at the output terminal $O_X$ is higher than that of the voltage $V_{OT}'$, shown by a dotted line in FIG. 6 and corresponding to a curve $V_{OT}'$ in FIG. 4, by the voltage of $V_{CC}$. In other words, the ciucuit in FIG. 5 may further boost the output voltage $V_{OT}$ higher than that boosted by the circuit in FIG. 3, by providing a single transistor $Q_1$, when the capacitances of the capacitors $C_1$ and $C_2$ are identical. An area forming the transistor $Q_1$ is a considerably smaller than that of the precharge capacitor. Accordingly, high boosting may be achieved without reducing the integration of the DRAM device.

To the contrary, when the boosting voltage equal to that in FIG. 3 is required, the capacitor $C_2$ may be greatly reduced compared to the capacitor $C_1$. This will contribute to the high integration of the DRAM device.

In the above embodiment, the booster circuit was described with reference to the RAM device, for boosting the word line of the device, however, the booster circuit may be also applied to other devices.

Many widely different embodiments of the present invention may be constructed without departing from the spirit and scope of the present invention. It should be understood that the present invention is not limited to the specific embodiments described in this specification, except as defined in the appended claims.

We claim:

1. A booster circuit for producing a boosted output signal comprising:

first and second power sources ($V_{CC}$, $V_{SS}$) for supplying a power source voltage;

a first driver circuit (20) connected between first and second power sources ($V_{CC}$, $V_{SS}$) and including a first bootstrap circuit ($C_{59}$, $Q_{58}$, $Q_{61}$), for receiving first and second signals ($\phi$, RST) having exclusive logic levels and producing a first output signal in response to said first and second signals;

a precharge capacitor ($C_2$) operatively connected to receive said first output signal from said first driver circuit, precharged to produce a second output signal when said second signal is supplied;

a second driver circuit (19) connected between said first and second power sources, receiving said first and second signals, and including a second bootstrap circuit ($C_{19}$ and $Q_{18}$) for producing a third output signal in response to said first and second signals, and a first switching circuit ($Q_{21}$) having a terminal connected to receive said second output signal from said precharge capacitor, and an output terminal for outputting said boosted output signal having a voltage level higher than said power source voltage, said first switching circuit switching to transfer said second output signal to said output terminal to form said boosted output signal in response to said third output signal; and a second switching circuit ($Q_1$) connected between said first power source and said output terminal and operating in response to said first signal ($\phi$), said second switching circuit outputting a voltage to said output terminal in response to said first signal in advance of the switching of said first switching circuit.

2. A booster circuit according to claim 1, wherein said second switching circuit comprises a transistor ($Q_1$).

3. A booster circuit according to claim 2, wherein said first switching circuit comprises a transistor ($Q_{21}$).

4. A booster circuit according to claim 3, wherein said third output signal of said second bootstrap circuit has a voltage level high enough to fully turn ON said transistor of said first switching circuit.

5. A booster circuit according to claim 4, wherein said first output signal of said first bootstrap circuit has a voltage level high enough to fully output said voltage in said precharge capacitor to said output terminal through said transistor in said first switching circuit.

6. A booster circuit according to claim 5, wherein said voltage of said output terminal has a level approximately the same as the level of said second power source voltage when said second signal is supplied to said second driver circuit.

7. A booster circuit according to claim 6, wherein said second signal has an enable state longer than that of said first signal.

8. A dynamic metal insulation semiconductor memory device, according to claim 1, further comprising:
a timing circuit (21) generating said first and second signals in response to a memory access signal ($\overline{RAS}$); and a word line (WL) operatively connected to said output terminal through a decoder (22), said output at said output terminal being supplied to said word line.

* * * * *